(12) United States Patent
Hirthammer

(10) Patent No.: US 7,405,570 B2
(45) Date of Patent: Jul. 29, 2008

(54) CONNECTOR FOR A MEASUREMENT ELEMENT IN A BATTERY SENSOR

(75) Inventor: Armin Hirthammer, Regensburg (DE)

(73) Assignee: Siemens Aktiengesellschaft, Munich (DE)

( * ) Notice: Subject to any disclaimer, the term of this patent is extended or adjusted under 35 U.S.C. 154(b) by 78 days.

(21) Appl. No.: 11/053,995

(22) Filed: Feb. 9, 2005

(65) Prior Publication Data
US 2005/0176282 A1 Aug. 11, 2005

(30) Foreign Application Priority Data
Feb. 9, 2004 (DE) .................. 10 2004 006 298

(51) Int. Cl.
*B60L 1/00* (2006.01)
*H01R 11/00* (2006.01)
*H01R 4/28* (2006.01)

(52) U.S. Cl. .................. 324/426; 307/10.1; 439/504; 439/754

(58) Field of Classification Search .................. 324/425, 324/426; 439/504, 726, 754
See application file for complete search history.

(56) References Cited

U.S. PATENT DOCUMENTS

| | | | | |
|---|---|---|---|---|
| 4,157,052 A | * | 6/1979 | Kulka ................. | 411/371.2 |
| 4,675,255 A | * | 6/1987 | Pfeifer et al. ................. | 429/92 |
| 4,966,325 A | * | 10/1990 | Anello et al. ................. | 232/57.5 |
| 5,621,197 A | | 4/1997 | Bender et al. ................. | 200/61.08 |
| 5,704,664 A | * | 1/1998 | Naumovski ................. | 292/288 |
| 5,725,399 A | | 3/1998 | Albiez et al. ................. | 439/762 |
| 6,148,797 A | * | 11/2000 | Gmelin ................. | 123/456 |
| 6,218,805 B1 | * | 4/2001 | Melcher ................. | 320/105 |
| 6,388,423 B1 | * | 5/2002 | Schilleci, Jr. ................. | 320/122 |
| 6,489,693 B1 | | 12/2002 | Hetzler ................. | 307/10.1 |
| 6,561,344 B1 | * | 5/2003 | Basse ................. | 198/844.1 |
| 6,787,935 B2 | | 9/2004 | Heim ................. | 307/10.1 |
| 2002/0051906 A1 | | 5/2002 | Wakata et al. ................. | 429/178 |
| 2002/0051907 A1 | | 5/2002 | Wakata et al. ................. | 429/178 |

(Continued)

FOREIGN PATENT DOCUMENTS

CH  678 469 A5  9/1991

(Continued)

OTHER PUBLICATIONS

Frank Meir et al.: "Das innovative Engergiemanagement des neuen BMW 5er" [the innovative power management of the new BMW 5 series], *MTZ*, Aug. 2003, pp. 116-119.

(Continued)

*Primary Examiner*—Vincent Q. Nguyen
*Assistant Examiner*—John Zhu
(74) *Attorney, Agent, or Firm*—Laurence A. Greenberg; Werner H. Stemer; Ralph E. Locher

(57) ABSTRACT

A connector assembly includes a battery pole terminal, a measurement element for a battery sensor, and a ground wire in the battery. The measurement element has two connections for connecting to the battery pole terminal and/or the battery cable, such that an electrically-conductive connection exists between the ground wire and the battery pole terminal by means of the measurement element. At least one of the connections is connected to the battery cable or the battery pole terminal by way of a force-locking or interference connection.

10 Claims, 1 Drawing Sheet

U.S. PATENT DOCUMENTS

| | | | |
|---|---|---|---|
| 2003/0017753 A1 | 1/2003 | Palmisano et al. | 439/762 |
| 2003/0057770 A1* | 3/2003 | Heim | 307/9.1 |
| 2004/0029516 A1* | 2/2004 | Richardson et al. | 452/198 |

FOREIGN PATENT DOCUMENTS

| | | |
|---|---|---|
| DE | 26 23 807 A1 | 12/1977 |
| DE | 44 25 307 A1 | 1/1996 |
| DE | 44 22 249 A1 | 2/1996 |
| DE | 195 07 959 C1 | 7/1996 |
| DE | 199 61 311 A1 | 7/2001 |
| DE | 100 31 243 A1 | 1/2002 |
| DE | 103 47 111 A1 | 5/2005 |
| EP | 1 030 185 B1 | 8/2000 |
| EP | 1 204 165 A1 | 5/2002 |
| EP | 1 204 166 A1 | 5/2002 |
| WO | 99/54744 | 10/1999 |

OTHER PUBLICATIONS

Herman Pöschl: "Verbindungselemente der Feinwerktechnik" [connecting elements in precision engineering], *Springer-Verlag,* Berlin/Göttingen/Heidelberg, 1954, pp. 55-65.

* cited by examiner

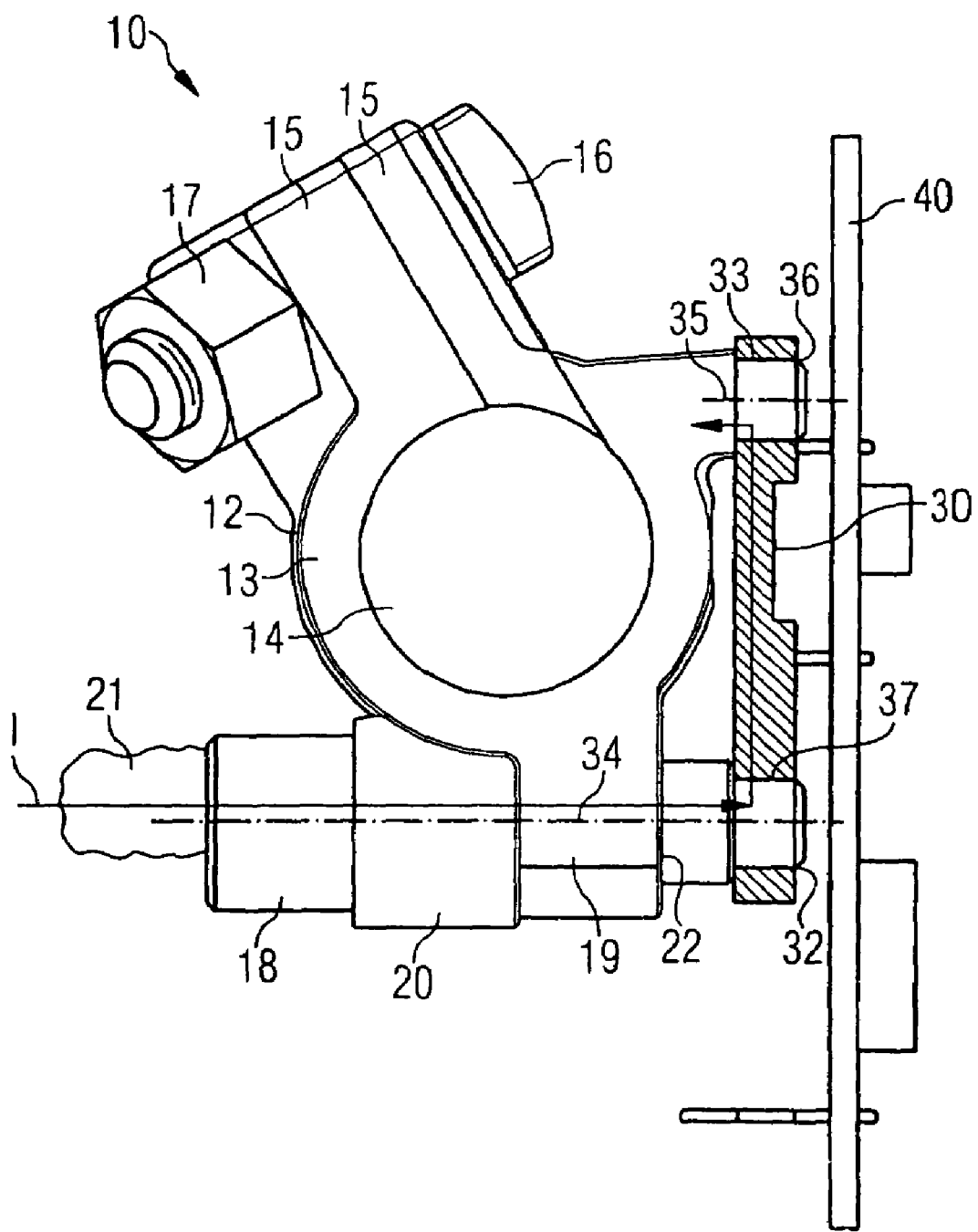

CONNECTOR FOR A MEASUREMENT ELEMENT IN A BATTERY SENSOR

BACKGROUND OF THE INVENTION

Field of the Invention

The invention relates to a connecting configuration by way of which a measurement element in a battery sensor can be connected to a pole terminal in a battery and/or battery cable of the battery. The configuration can thereby be used particularly in motor vehicle batteries, to which a measurement sensor is attached that serves to detect different parameters of the battery, for example the battery current.

The constant evaluation of the battery parameters keeps track of the state of charge of the battery. In addition to the current state of charge, the battery wear status and/or other battery dependent conditions, for example the prognosis of the battery temperature for the next motor vehicle start-up are also of interest.

In order to detect these variables and particularly to measure the battery current in a motor vehicle battery, it is known to integrate a battery sensor in the battery, particularly in the battery pole niche, said battery sensor comprising a measurement element, the captured data of which is evaluated. To determine the battery current, the measurement element is a measurement resistor, particularly a precision resistor.

With the prior art configuration, where the measurement resistor is arranged between the pole terminal in a battery and its ground wire, a weld joint or a soldered joint is provided between the measurement resistor and the pole terminal or between the ground wire and the measurement resistor. In addition to the mechanical connection of the components, this weld joint guarantees the necessary electrical line, but is nevertheless costly to manufacture.

SUMMARY OF THE INVENTION

It is accordingly an object of the invention to provide a connector for a measurement element of a battery sensor which overcomes the above-mentioned disadvantages of the heretoforeknown devices and methods of this general type and which provides for an improved connector for a measurement element in a battery sensor using the battery pole terminal in a battery and a battery cable in a battery (ground wire and/or wire on + side) such that the current conducts at the lowest possible resistance across the connecting part and is furthermore easy to manufacture.

With the foregoing and other objects in view there is provided, in accordance with the invention, a connector assembly, comprising:
a battery pole terminal;
a battery cable for a battery connection;
a measurement element for a battery sensor, said measurement element having a first connection for connecting to said battery pole terminal and a second connection for connecting to said battery cable, forming an electrically conductive connection between said battery cable and said battery pole terminal via said measurement element;
wherein at least one of said first connection and said second connection is a force-locking connection.

A force-locking connection—also referred to as a friction lock, a frictional connection, or an interference connection—is one that connects two elements together by force external to the elements, or to at least the locked element. This is opposed to a form-locking or positive connection, which is provided by the shapes of the elements themselves.

The invention is based on the concept of simplifying the connection between the measurement element and the battery pole terminal, and the connection between the measurement element and the connection of the battery cable such that an interference connection is produced between these elements, thereby dispensing with a relatively costly weld joint. The electrical conductivity which is essential for the connector is achieved across the connecting region by virtue of the interference connection, in other words, the direct contact subject to contact pressure between the conducting elements. This is particularly valid if the measurement element is configured as a measurement resistor, in other words, a metallic component, and the corresponding connector in the terminal pole and/or the battery cable is similarly formed from electrically-conductive, metallic material for instance, so that a precise alignment of the elements towards one another is not necessary. If other only regionally electrically-conductive components such as pressured circuits, film wires or the like are used as the measurement resistors and/or as the connecting element on the side of the pole terminal and/or the battery wire, an easily producible, electrically-conductive connection between these elements can be ensured by means of an interference connection, if the conductive parts are aligned respectively to one another. In this way, the battery cable can be both the ground wire and the wire on the + side of the battery.

The force-lock connection is preferably designed as compression fit, i.e. an interference connection whereby the parts which are to fit together are joined using high pressure or by shrinking and/or stretching. Alternatively a compression fit can also be used in which the parts to be connected are joined together in the same way as with a press fit, but nevertheless do not have particular fit but are merely oversize. By way of example, one of the surfaces can be keyed or knurled. A compression method can also be understood as a method by means of which a subsequent distortion generates the tight fit. These types of method can be used, provided an adequate surface contact of the components to be connected is ensured, so that the current can be conducted with the lowest possible resistance via the connecting part. Air gaps should be particularly avoided in the region of the connecting part. A weld joint can be executed in addition to the interference connection or compression in each instance.

Other features which are considered as characteristic for the invention are set forth in the appended claims.

Although the invention is illustrated and described herein as embodied in a connector for a measurement element in a battery sensor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

BRIEF DESCRIPTION OF THE DRAWING

The sole FIGURE of the drawing shows a partly cross-sectional perspective view of a connector according to the invention.

DESCRIPTION OF THE PREFERRED EMBODIMENTS

Referring now to the drawing in detail, the connector 10 shown therein contains a battery pole terminal 12, which is attached around a battery post or pole terminal 14 of a non-illustrated battery and which is preferably disposed in a protected location in the battery pole niche of the battery. The battery pole terminal 12 comprises a substantially annular region 13, which encloses the battery pole 14 when the battery pole terminal is fitted. Two legs 15 separated from one another are attached to this annular region 13, which allow an expansion of the annular region 13, whereby the legs 15 are pressed apart and spread out. To attach the battery pole terminal 12 to the battery pole 14 in a battery, a connecting element, e.g. a screw 16 which screws into a nut 17, is guided through the corresponding hole in the legs 15. A fixed connection between the annular region 13 of the battery pole terminal and the battery pole 14 is produced by tightening the nut 17.

The battery pole terminal 12 also comprises another leg 19, arranged on the side of the battery pole terminal 12 facing away from the legs 15, and similarly projects outwards from the annular region of the battery pole terminal. A socket is integrated into the leg 19 in the form of a through-hole 22 for example, into which a connection bolt 18 of a ground wire 21 can be introduced and fixed. Alternatively, if another device for fixing the position of the connecting bolt 18 is provided, in the battery pole niche itself for example, the leg 19 and also the socket can be dispensed with. An indentation can be provided instead of a passage opening 22 for the bolt 18 of the ground wire 21 into which the connection bolt 18 is inserted.

An insulating sleeve 20 is attached to the connecting bolt 18 where it passes through the similarly electrically-conductive battery pole terminal 12, the insulating sleeve preferably being manufactured from an electrically-conductive material, brass or copper for instance, thereby preventing a direct conduction of electrical current through the bolt 18 into the battery pole terminal 12 bypassing the measurement element 30. The sleeve must be dimensioned such that it insulates the entire area where the connecting bolt and the pole terminal 12 could come into contact with one another.

The assembly 10 further contains a measurement element 30, which is designed as a precision resistor for instance, and is similarly formed from metallic materials, brass and copper. The use of a magnetic measurement element instead of a precision resistor for example is also considered. Holes 32, 33 are formed in the measurement element 30 at predetermined locations, the holes being dimensioned such that they can contract into a tight fit at the connecting bolt 18 of the ground wire 21 and/or at the battery pole terminal 12 with connecting spigots 34, 35. The diameter of the spigots 34, 35 is thus fractionally greater than the diameter of the holes 32, 33. In the embodiment shown, holes are provided on the measurement element 30 whilst corresponding connecting spigots 34, 35 are formed at the connecting pulse of the ground wire 18 and/or the battery pole terminal. It is also possible to provide the measurement resistor and/or the measurement element 30 with corresponding projections, with recesses being provided in the battery pole terminal and/or the connecting bolts of the ground wire. Instead of the oversize described, the spigots 34, 35 can be provided with ribs or a knurl with oversize, the spigots are compressed into the holes or the recesses by means of subsequent distortion.

The positions for the holes 32, 33 and thus the press connections are disposed on the measurement element such that current fed from the connecting spigot 18 of the ground wire flows via the press fit 37 between the connection spigot 34 of the connection bolt 18 and the measurement element 30 into the measurement element 30, and flows through the measurement element 30 and via the tight fit 36 between the measurement element 30 on the connection spigot 35 of the battery pole terminal 12 in the battery pole terminal and vice versa. The path of the current flow is indicated by means of arrow I. The connection spigot 35 at the battery pole terminal 12 can be configured at each suitable position in the battery pole terminal provided the desired current flow path is ensured. The current flow through the measurement element is evaluated in order to detect the battery parameters.

Instead of the arrangement shown, in which one end of the measurement section in the measurement element 30 is directly connected to the battery pole terminal 12, the measurement resistor and/or measurement element 30 can be inserted between two segments of the ground wire, whereby a connection is produced between measurement element 30 and ground wire 21 across a tight fit in a similar manner to the connection 37 in each instance. It is also possible to provide a tight fit not at both ends of the measurement section of the measurement element 30, in other words, not at the ends of the measurement section at which the current in the measurement section is fed and at the end at which the current is fed away from the measurement section, but rather only to design one of the connections over a tight fit, whilst the other connection is typically a weld joint or a soldered joint.

The connector 10 further contains additional sensor components 40, which are linked to the measurement element 30, and are taken off and evaluated there if necessary. These sensor components 40 can also serve to fix the connector, in addition to fixing the connector between the pole terminal 12 and the battery pole 14 in the battery pole niche and/or at another position in the motor vehicle. This is particularly advantageous if the measurement element 30 is applied between two sections in the ground wire.

The essential aspect of the invention lies in simplifying the conventional costly weld joint in order to integrate a measurement element 30 for a battery sensor in the arrangement in the battery pole niche, in particular between battery pole terminal 12 and ground wire 2 such that a connection bolt in the ground wire 21 and/or a connecting pin or spigot 35 in the battery pole terminal is connected to the measurement element 30 by means of a tight-fitting connection, an interference fit for example.

This application claims the priority, under 35 U.S.C. § 119, of German patent application No. 10 2004 006 298.6, filed Feb. 9, 2004; the entire disclosure of the prior application is herewith incorporated by reference.

I claim:

1. A connector assembly, comprising:
    a battery pole terminal formed with a pin-shaped protection;
    a battery cable for a battery connection;
    a measurement element for a battery sensor, said measurement element having a first connection for connecting to said battery pole terminal and a second connection for connecting to said battery cable, forming an electrically conductive connection between said battery cable and said battery pole terminal via said measurement element;
    wherein at least one of said first connection and said second connection is a press fit connection effected by compression between a bore formed in said measuring element and said pin-shaped protection formed on said battery pole terminal, and wherein said bore is undersized relative to said protection.

2. The connector assembly according to claim 1, wherein said measuring element is disposed directly adjoining said battery pole terminal.

3. The connector assembly according to claim 1, wherein said battery cable has sections and said measuring element is disposed between two sections of said battery cable.

4. The connector assembly according to claim 1, wherein said battery pole terminal is formed with a through-opening and said battery cable has a connecting bolt protruding through said through-opening, and said connecting bolt is provided with an insulating sleeve in a region where said connecting bolt passes through said through-opening in said battery pole terminal.

5. The connector assembly according to claim 4, wherein said connecting bolt is formed with a pin-shaped projection at an end facing away from said battery cable, and said pin-shaped projection is compressed with said measurement element.

6. The connector assembly according to claim 1, wherein said measurement element is a measurement resistor.

7. The connector assembly according to claim 1, wherein said measurement element is a precision resistor.

8. The connector assembly according to claim 1, wherein said battery pole terminal is compressed onto said measurement element.

9. A connector assembly, comprising:
a battery pole terminal:
a battery cable for a battery connection and a connecting bolt for said battery cable. said connecting bolt having a protection formed thereon:
a measurement element for a battery sensor, said measurement element having a first connection for connecting to said battery pole terminal and a second connection for connecting to said battery cable, forming an electrically conductive connection between said battery cable and said battery pole terminal via said measurement element;
wherein said second connection is a press fit connection is effected by compression between a bore formed in said measuring element and said protection formed on said connecting bolt for said battery cable, and wherein said bore is undersized relative to said projection.

10. A connector assembly, comprising:
a battery pole terminal formed with a projection:
a battery cable for a battery connection and a connecting bolt for said battery cable, said connecting bolt having a protection formed thereon;
a measurement element for a battery sensor, said measurement element having a first connection for connecting to said battery pole terminal and a second connection for connecting to said battery cable, forming an electrically conductive connection between said battery cable and said battery pole terminal via said measurement element;
wherein said first connection and said second connection are press fit connections respectively effected by compression between a first bore formed in said measuring element and said projection on said battery pole terminal, and by compression between a second bore formed in said measuring element and said protection on said connecting bolt for said battery cable, and wherein said first and second bores are undersized relative to the respective said projections.

* * * * *